United States Patent
Fujiwara et al.

(10) Patent No.: US 7,855,131 B2
(45) Date of Patent: Dec. 21, 2010

(54) MANUFACTURING METHOD OF A SEMICONDUCTOR DEVICE

(75) Inventors: Hirokazu Fujiwara, Nishikamo-gun (JP); Masaki Konishi, Toyota (JP); Takeo Yamamoto, Nishikamo-gun (JP); Eiichi Okuno, Mizuho (JP); Yukihiko Watanbe, Nagoya (JP); Takashi Katsuno, Ichinomiya (JP)

(73) Assignees: Toyota Jidosha Kabushiki Kaisha, Toyota (JP); Denso Corporation, Kariya (JP)

( * ) Notice: Subject to any disclaimer, the term of this patent is extended or adjusted under 35 U.S.C. 154(b) by 0 days.

(21) Appl. No.: 12/385,782

(22) Filed: Apr. 20, 2009

(65) Prior Publication Data

US 2009/0269908 A1  Oct. 29, 2009

(30) Foreign Application Priority Data

Apr. 23, 2008  (JP)  ............... 2008-113063

(51) Int. Cl.
H01L 21/322  (2006.01)
(52) U.S. Cl. ............... 438/476; 438/514; 438/766; 257/77; 257/758
(58) Field of Classification Search ............... 438/476, 438/514, 519, 766, 931; 257/77, 613, 758, 257/E21.055
See application file for complete search history.

(56) References Cited

U.S. PATENT DOCUMENTS

| 5,087,576 A * | 2/1992 | Edmond et al. | 438/522 |
| 6,294,444 B1 * | 9/2001 | Ueno | 438/514 |
| 2006/0220027 A1 * | 10/2006 | Takahashi et al. | 257/77 |
| 2008/0251928 A1 * | 10/2008 | Chang et al. | 257/762 |

FOREIGN PATENT DOCUMENTS

| JP | A-11-340158 | 12/1999 |
| JP | A-2001-068428 | 3/2001 |
| JP | A-2005-068428 | 3/2001 |

* cited by examiner

Primary Examiner—Phuc T Dang
(74) Attorney, Agent, or Firm—Oliff & Berridge, PLC

(57) ABSTRACT

A manufacturing method of a semiconductor device comprises a process of doping conductive impurities in a silicon carbide substrate, a process of forming a cap layer on a surface of the silicon carbide substrate, a process of activating the conductive impurities doped in the silicon carbide substrate, a process of oxidizing the cap layer after a first annealing process, and a process of removing the oxidized cap layer. It is preferred that the cap layer is formed from material that includes metal carbide. Since the oxidation onset temperature of metal carbide is comparatively low, the oxidization of the cap layer becomes easy if metal carbide is included in the cap layer. Specifically, it is preferred that the cap layer is formed from metal carbide that has an oxidation onset temperature of 1000 degrees Celsius or below, such as tantalum carbide.

5 Claims, 6 Drawing Sheets

MANUFACTURING METHOD OF A SEMICONDUCTOR DEVICE

CROSS-REFERENCE TO RELATED APPLICATION

This application claims priority to Japanese Patent Application No. 2008-113063, filed on Apr. 23, 2008, the contents of which are hereby incorporated by reference into the present application.

BACKGROUND OF THE INVENTION

1. Field of the Invention

The present invention relates to a manufacturing method of a semiconductor device. In particular, the present invention relates to an annealing process that activates conductive impurities doped in a silicon carbide substrate.

2. Description of the Related Art

Many semiconductor devices that utilize silicon carbide in a substrate material have been developed. In manufacturing a semiconductor device that utilizes a silicon carbide substrate, an annealing process in which the silicon carbide substrate is heated to a high temperature close to 2000 degrees Celsius is performed in order to activate the conductive impurities that have been doped. In this type of high temperature annealing process, the silicon carbide substrate may be damaged. That is, the following problems may readily occur: silicon atoms or conductive impurities may depart from the surface of the silicon carbide substrate to the exterior, thereby damaging the surface of the silicon carbide substrate or reducing the concentration of impurities in its surface layer part.

In order to deal with this problem, Japanese Patent Application Publication No. 2001-68428 teaches a technique in which a surface of a silicon carbide substrate is covered by a cap layer prior to an annealing process. In this technique, the cap layer is formed from DLC (diamond like carbon). According to Patent Document 1, with the cap layer that is formed from DLC, hydrogen atoms or oxygen atoms that leave during the annealing process are graphitized. The melting point of graphite exceeds 3000 degrees Celsius. As a result, in cases where the cap layer is formed from DLC, the surface of the silicon carbide substrate is reliably protected even if the annealing process is performed at a high temperature close to 2000 degrees Celsius.

BRIEF SUMMARY OF THE INVENTION

According to the conventional technique, the graphitized cap layer can be removed by being oxidized. However, as the carbon atoms are tightly coupled with one another in graphite, it is not easy to completely oxidize graphite. As a result, a process of irradiating plasmified oxygen is necessary in order to oxidize the graphitized cap layer.

Taking the above problem into account, the present invention sets forth a technique in which the cap layer formed on the surface of the silicon carbide substrate can be removed easily in a later process.

A manufacturing method of a semiconductor device is realized in the present teachings. This manufacturing method of a semiconductor device comprises: doping conductive impurities in a silicon carbide substrate, forming a cap layer on a surface of the silicon carbide substrate, activating the conductive impurities doped in the silicon carbide substrate by heat-treating the silicon carbide substrate in a deoxygenized atmosphere, oxidizing the cap layer formed on the silicon carbide substrate by heat-treating the silicon carbide substrate in an oxygen-containing atmosphere, and removing the oxidized cap layer from the silicon carbide substrate. The cap layer includes at least one kind of metal carbide.

In the manufacturing method of the present teachings, the surface of the silicon carbide substrate is protected by the cap layer when the conductive impurities are activated by heat-treating the silicon carbide substrate. Damage to the silicon carbide substrate can thereby be avoided.

The cap layer is formed utilizing metal carbide. Metal carbide has a lower oxidation onset temperature than graphite. As a result, the cap layer can easily be oxidized without heating the silicon carbide substrate to a high temperature. The process of performing irradiation with plasmified oxygen, as in the conventional technique, is not required. The cap layer that is formed from metal carbide becomes extremely brittle due to oxidation, and thus can easily be removed.

According to the manufacturing method of the present teachings, the cap layer formed on the silicon carbide substrate can easily be removed without performing a complicated process.

It is preferred that the melting point of the at least one kind of metal carbide is higher than a heat-treatment temperature for activating the conductive impurities, and that the oxidation onset temperature of the at least one kind of metal carbide is lower than 1000 degrees Celsius.

In this case, it is possible to set the heat-treatment temperature when the cap layer is to be oxidized to be lower than 1000 degrees Celsius. If the heat-treatment temperature is lower than 1000 degrees Celsius, the silicon carbide substrate is not damaged.

Further, it is preferred that the melting point of the at least one kind of metal carbide is higher than the melting point of the silicon carbide substrate.

The heat-treatment temperature when the conductive impurities are to be activated is set in accordance with the type of conductive impurities. However, this heat-treatment temperature is not set to be equal to or above the melting point of the silicon carbide substrate. As a result, if the melting point of the metal carbide is higher than the melting point of the silicon carbide substrate, the surface of the silicon carbide substrate can always be protected regardless of the type of conductive impurities to be activated.

It is preferred that the at least one kind of metal carbide is one or more of tantalum carbide, titanium carbide, zirconium carbide, hafnium carbide, vanadium carbide, or niobium carbide.

These metal carbides have a melting point of 3000 degrees Celsius or above, and have an oxidation onset temperature of 1000 degrees Celsius or below, and thus have characteristics suitable for being the material from which the cap layer is formed. In particular, tantalum carbide does not form a passivation film when it is changed into tantalum oxide by means of an oxidation reaction, and consequently the oxidation reaction is performed reliably even at a deep portion of the cap layer. Further, because tantalum oxide has an extremely brittle nature, a plurality of cracks is formed in the cap layer due to the volume change during the oxidation reaction. If the cap layer is formed from tantalum carbide, the entirety of the cap layer can thus be oxidized reliably and the cap layer after oxidation can easily be removed.

According to the method of the present teachings, as described above, the cap layer formed on the surface of the silicon carbide substrate can easily be removed in a later process, and a system of manufacturing a semiconductor device utilizing silicon carbide can be configured simply.

DETAILED DESCRIPTION OF THE INVENTION

Preferred Features of an Embodiment of the Invention (Feature 1) It is preferred that the silicon carbide substrate is a 4H—SiC hexagonal structure, and has an off angle.

(Feature 2) It is preferred that a first annealing process is performed in an inert gas atmosphere comprising nitrogen or argon.

(Feature 3) It is preferred that a process temperature of the first annealing process is a temperature that activates conductive impurities in the silicon carbide substrate, and that the first annealing process is performed within a temperature range between 1000 and 2000 degrees Celsius.

(Feature 4) It is preferred that a second annealing process is performed in a mixed atmosphere of oxygen and an inert gas comprising nitrogen or argon.

(Feature 5) It is preferred that the process temperature of the second annealing process is a temperature that does not affect the crystal structure of the silicon carbide substrate, and is performed at 1000 degrees Celsius or below.

(Feature 6) It is preferred that the second annealing process is performed utilizing the remaining heat of the silicon carbide substrate that was heated in the first annealing process. That is, it is preferred that the silicon carbide substrate is placed in an oxygen-containing atmosphere at the time when the temperature of the silicon carbide substrate that was heated in the first annealing process becomes 1000 degrees Celsius or below, this being above the oxidation onset temperature of the cap layer.

EMBODIMENT OF THE INVENTION

Figure 1:
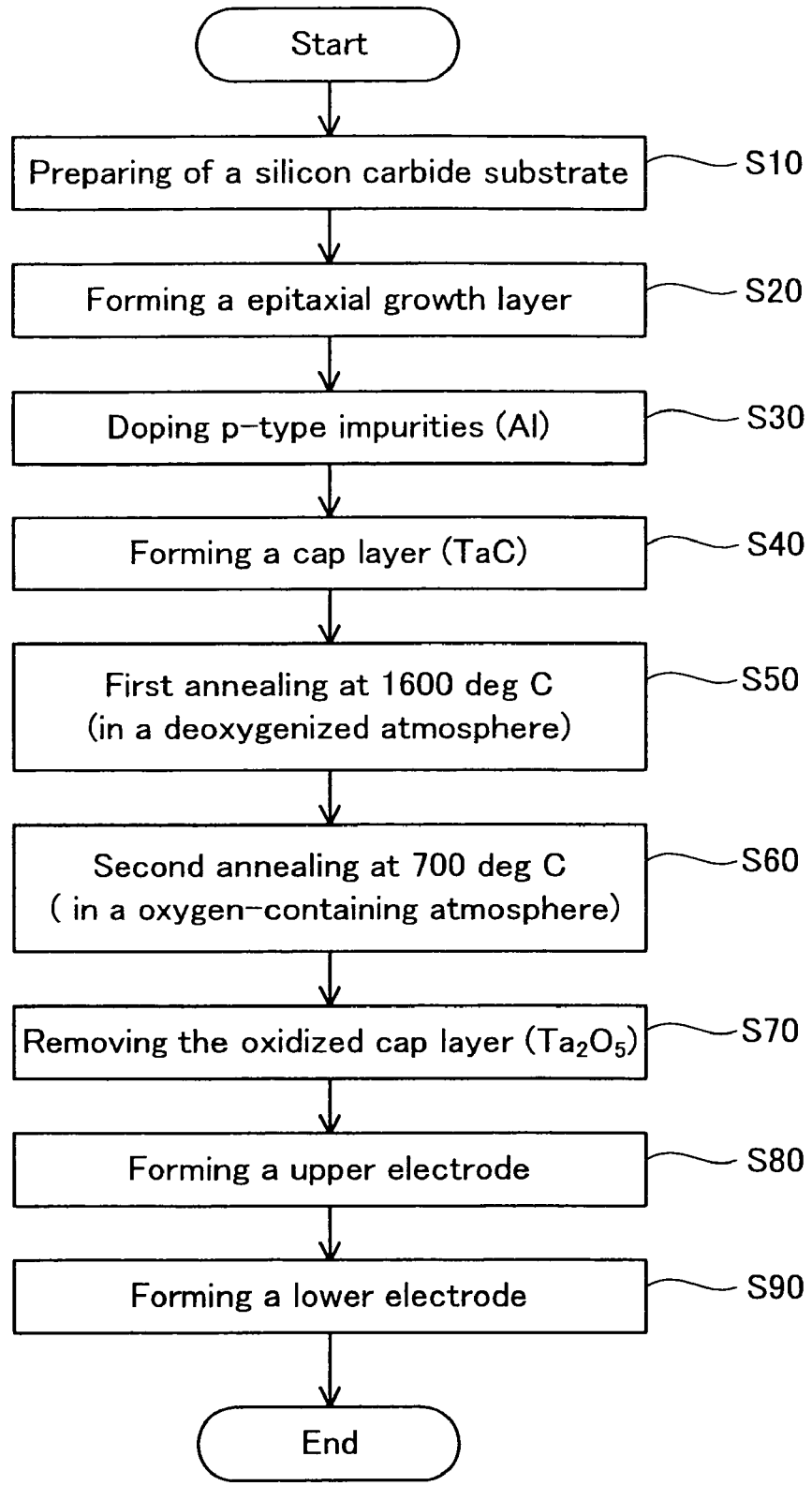
FIG. 1 is a flowchart showing the flow of a manufacturing method of a semiconductor device of the present embodiment.

An embodiment of the present invention will be described with reference to the figures. FIG. 1 is a flowchart showing the manufacturing method of a semiconductor device of the present invention. Moreover, in the present embodiment, the manufacturing method will be described of a semiconductor device 10 shown in FIG. 2 and FIG. 3. The semiconductor device 10 has a Schottky barrier diode structure 12 and a pn diode structure 14 formed alternately, and is a junction barrier Schottky diode (JBS).

Figure 2:
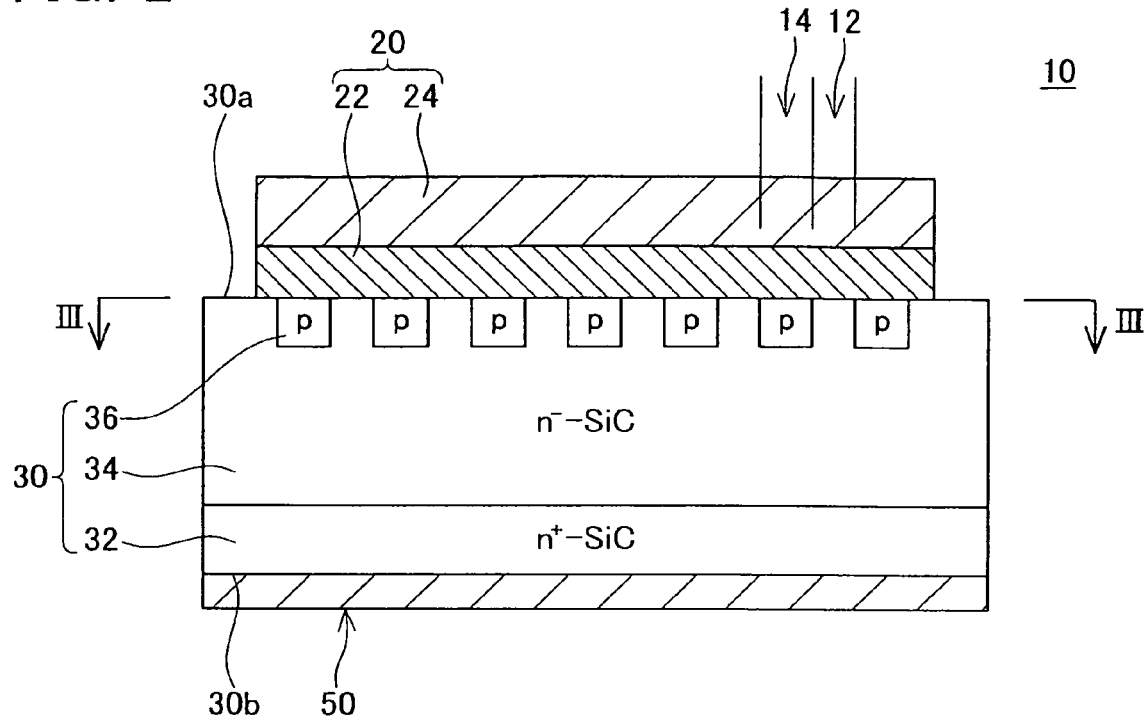
FIG. 2 is a cross-sectional view of the structure of the semiconductor device.

Before the manufacturing method of the present embodiment is described, the structure of the semiconductor device 10 will be described. As shown in FIG. 2, the semiconductor device 10 mainly comprises a silicon carbide substrate 30, an upper electrode 20 formed on an upper surface 30a of the silicon carbide substrate 30, and a lower electrode 50 formed on a lower surface 30b of the silicon carbide substrate 30.

The silicon carbide substrate 30 is silicon carbide crystal that has a hexagonal crystal structure (specifically, 4H—SiC), and has an off angle of 4 degrees. The silicon carbide substrate 30 has a contact layer 32 that includes a high concentration of n-type impurities and a drift layer 34 that includes a low concentration of n-type impurities. In the semiconductor device 10 of the present embodiment, as an example, nitrogen (N) is used in the n-type impurities. Further, the concentration of the impurities in the contact layer 32 is adjusted to $5 \times 10^{18}/cm^3$, and the concentration of the impurities in the drift layer 34 is adjusted to $5 \times 10^{15}/cm^3$. Further, the thickness of the drift layer 34 is 13 µm.

A p-type semiconductor region 36 is formed in the silicon carbide substrate 30. The p-type semiconductor region 36 is formed in a range that comprises the pn diode manufacturing part 14 in the silicon carbide substrate 30. In the pn diode manufacturing part 14, an n-type semiconductor region (the contact layer 32 and the drift layer 34) and the p-type semiconductor region 36 are stacked from the lower surface 30b to the upper surface 30a of the silicon carbide substrate 30. Alternatively, in a range that comprises the Schottky barrier diode structure 14, only an n-type semiconductor region (the contact layer 32 and the drift layer 34) is present from the lower surface 30b to the upper surface 30a of the silicon carbide substrate 30.

The p-type semiconductor region 36 is formed in an upper layer portion of the drift layer 34, and is exposed at the upper surface 30a of the silicon carbide substrate 30. In the semiconductor device 10 of the present embodiment, as an example, aluminum (Al) is utilized in the p-type impurities, and the concentration of the impurities is adjusted to $1 \times 10^{19}/cm^3$.

Figure 3:
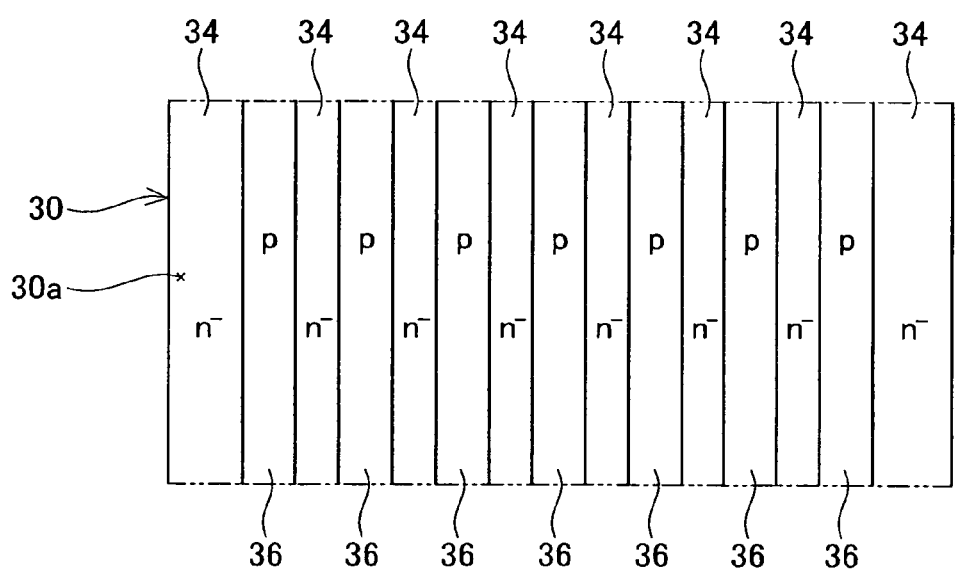
FIG. 3 is a cross-sectional view along the line III-III of FIG. 2.

FIG. 3 is a cross-sectional view along the line III-III of FIG. 2, and shows the upper surface 30a of the silicon carbide substrate 30. As shown in FIG. 2 and FIG. 3, the p-type semiconductor region 36 extends along a left-right direction of the figures, and is formed in a striped shape. The n⁻ type drift layer 34 and the p-type semiconductor region 36 are thereby exposed alternately along a left-right direction of the figures at the upper surface 30a of the silicon carbide substrate 30. In the semiconductor device 10 of the present embodiment, as an example, the width of the p-type semiconductor region 36 is 2 µm, the pitch (interval) of the p-type semiconductor region 36 is 5 µm, and the thickness D thereof is 0.5 µm. However, the dimensions of the p-type semiconductor region 36 are not restricted to these values.

Further, the pattern forming the p-type semiconductor region 36 is not restricted to the striped shape of the present embodiment. For example, the p-type semiconductor region 36 may be formed in a lattice pattern, or may be formed in a honeycomb pattern.

Next, the upper electrode 20 will be described. As shown in FIG. 2, the upper electrode 20 mainly comprises a Schottky electrode 22 formed from a first type of metal material, and a main electrode 24 formed from a second type of metal material. That is, the Schottky electrode 22 and the main electrode 24 are formed from different metal materials. The Schottky electrode 22 makes Schottky contact with the drift layer 34 exposed at the upper surface 30a of the silicon carbide substrate 30, and makes substantially ohmic contact with the p-type semiconductor region 36 exposed at the upper surface 30a of the silicon carbide substrate 30. The main electrode 24 is formed on an upper part of the Schottky electrode 22, and covers the Schottky electrode 22 from above. In the present embodiment, as an example, the Schottky electrode 22 is formed from molybdenum, and the main electrode 24 is formed from aluminum. Further, the thickness of the Schottky electrode 22 is 200 nm, and the thickness of the main electrode 24 is 3 μm.

The lower electrode 50 is formed on the lower surface 30b of the silicon carbide substrate 30, and makes ohmic contact with a contact layer 32. The structure of a normal ohmic contact electrode can be adopted for the lower electrode 50. Specifically, the lower electrode 50 can be a Ti/Ni/Au stacked structure, or a NiSi/Ni/Au stacked structure.

Next, the operation of the semiconductor device 10 will be described. In the case where reverse bias is applied to the semiconductor device 10 (by such the upper electrode 20 has low potential), a depletion layer extends from a pn junction surface between the p-type semiconductor region 36 and the drift layer 34, and the drift layer 34 making contact with the Schottky electrode 22 is depleted. The problematic occurrence of leaking current and surge resistance insufficiency are thereby improved in the Schottky barrier diode structure 14. Alternatively, during forward bias, a forward voltage drop (on resistance) is suppressed by the Schottky barrier diode structure 14.

Next, the manufacturing method of the semiconductor device 10 will be described following the flowchart shown in FIG. 1. Moreover, only the processes for manufacturing one semiconductor device 10 are shown in the description below. However, as in the case of the normal manufacturing method of semiconductor devices, a plurality of semiconductor devices 10 is manufactured simultaneously from a single wafer.

Figure 4:
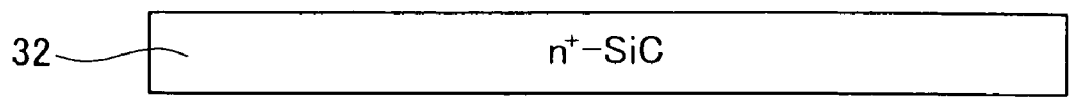
FIG. 4 shows a state of a semi-finished product of the semiconductor device in step S10.

First, in step S10, as shown in FIG. 4, an n-type silicon carbide wafer 32 is prepared. The silicon carbide wafer 32 becomes the contact layer 32 when the semiconductor device 10 is completed. In the present embodiment, the silicon carbide wafer 32 that has a 4H structure and an off angle of 4 degrees is prepared in order to obtain a homogenous crystal structure during epitaxial growth (to be described).

Figure 5:
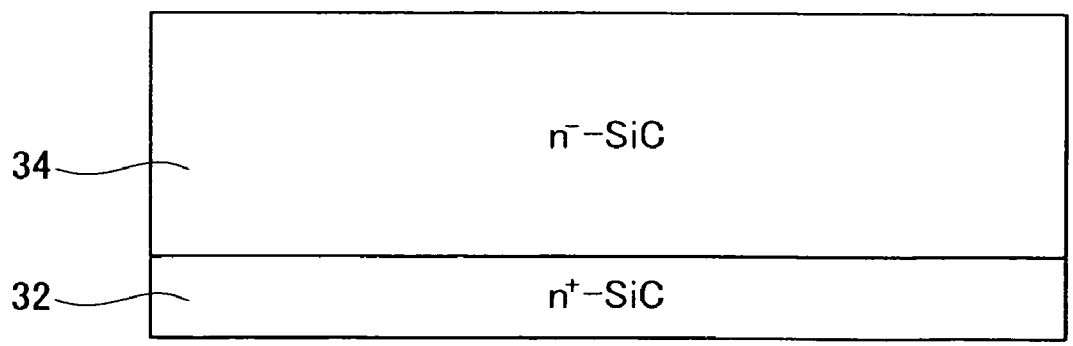
FIG. 5 shows a state of a semi-finished product of the semiconductor device in step S20.

Next, in step S20, as shown in FIG. 5, crystal growth of the silicon carbide wafer 32 is performed, forming an epitaxial growth layer 34. Nitrogen that is an n-type impurity is included at a concentration of $5 \times 10^{15}/cm^3$ when the epitaxial growth layer 34 is formed. The epitaxial growth layer 34 becomes the drift layer 34 when the semiconductor device 10 is completed.

Figure 6:
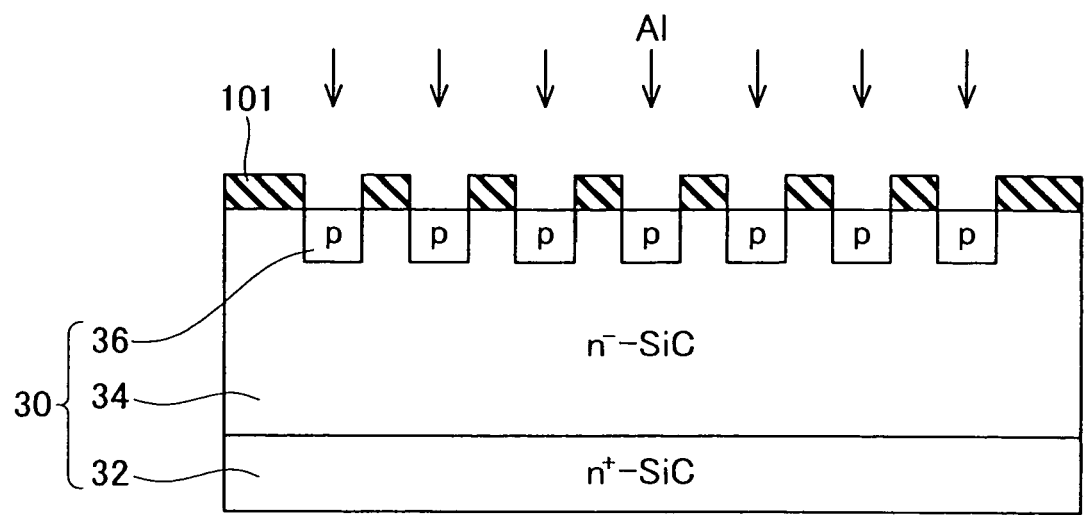
FIG. 6 shows a state of a semi-finished product of the semiconductor device in step S30.

Next, in step S30, as shown in FIG. 6, aluminum that is a p-type impurity is doped in the epitaxial growth layer 34, forming the p-type semiconductor region 36. After a mask 101 has been formed by photolithography, the doping of the p-type impurities can be performed by ion injection. In the present embodiment, as described earlier, the p-type semiconductor region 36 is formed in a striped shape (see FIG. 3). The silicon carbide substrate 30 that has the contact layer 32, the drift layer 34, and the p-type semiconductor region 36 is formed by means of the above processes.

Figure 7:
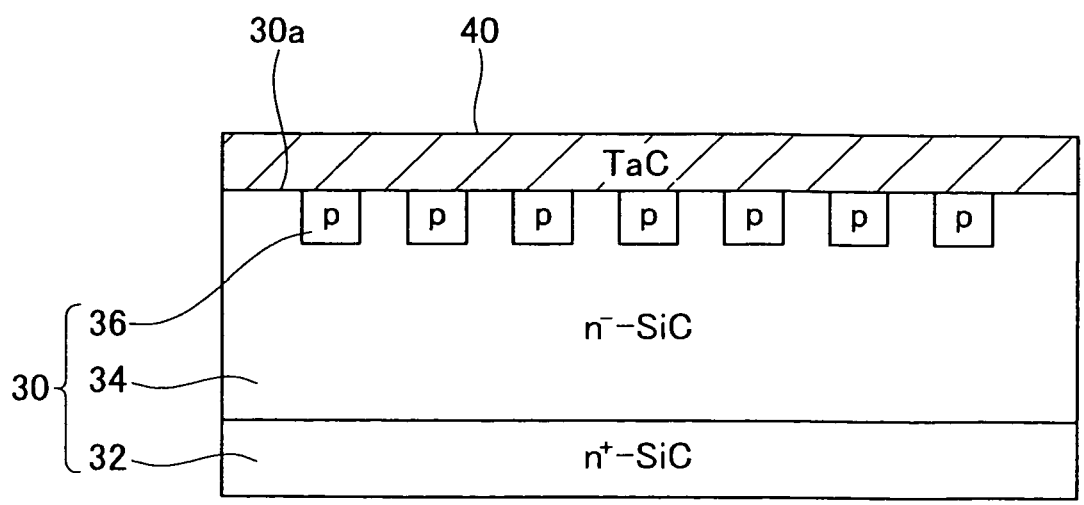
FIG. 7 shows a state of a semi-finished product of the semiconductor device in step S40.

Next, in step S40, as shown in FIG. 7, a cap layer 40 is formed on the upper surface 30a of the silicon carbide substrate 30. The cap layer 40 is a protective layer for protecting the upper surface 30a of the silicon carbide substrate 30 during the first annealing process of step S50 (to be described below in detail). As a result, the melting point of the material forming the cap layer 40 must be higher than the heating temperature in the first annealing process (1700 degrees Celsius in the present embodiment). In the present embodiment, the cap layer 40 is formed from tantalum carbide (TaC). Tantalum carbide has the extremely high melting point of 3380 degrees Celsius, and has outstanding heat resistance. Further, tantalum carbide is a material that is stable with respect to silicon carbide, and does not undergo a chemical reaction with silicon carbide even in high temperatures such as those exceeding 1000 degrees Celsius. A cap layer consisting of tantalum carbide can be formed, for example, by the thermal CVD method, or by the ion plating method.

Figure 8:
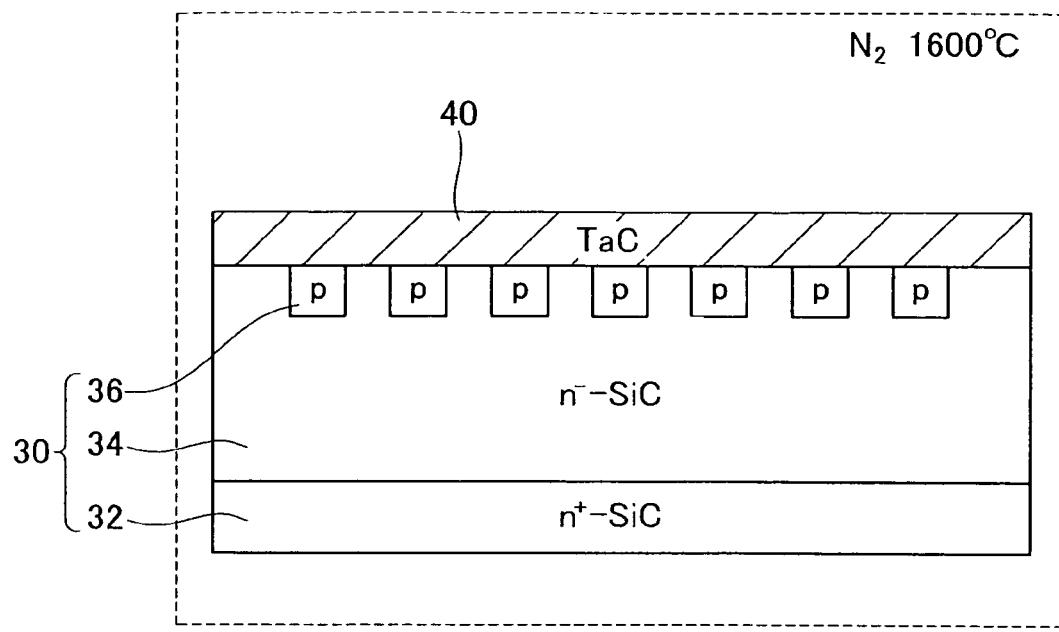
FIG. 8 shows a state of a semi-finished product of the semiconductor device in step S50.

Next, in step S50, as shown in FIG. 8, the first annealing process is performed, in which heat-treatment is performed on the silicon carbide substrate 30 that has the cap layer 40 formed thereon. The first annealing process is performed in order to activate the conductive impurities (aluminum, etc.) doped in the silicon carbide substrate 30. The first annealing process is performed in a deoxygenized atmosphere (an atmosphere in which oxygen is essentially absent), and the process temperature is set at 1700 degrees Celsius. In the present embodiment, as an example, the first annealing process is performed in a nitrogen atmosphere. Moreover, the first annealing process may be performed in another inert gas atmosphere such as argon, for example. Since the first annealing process is performed in a deoxygenized atmosphere, the cap layer 40 that is formed from tantalum carbide is stable even at the high process temperature of 1700 degrees Celsius.

In the first annealing process, the upper surface 30a of the silicon carbide substrate 30 is protected by the cap layer 40. Silicon atoms or the conductive impurities are thereby prevented from departing to the outside from the upper surface 30a of the silicon carbide substrate 30. As a result, the upper surface 30a of the silicon carbide substrate 30 is not damaged, and a reduction in the concentration of the conductive impurities in the vicinity of the upper surface 30a of the silicon carbide substrate 30 is prevented.

Figure 9:
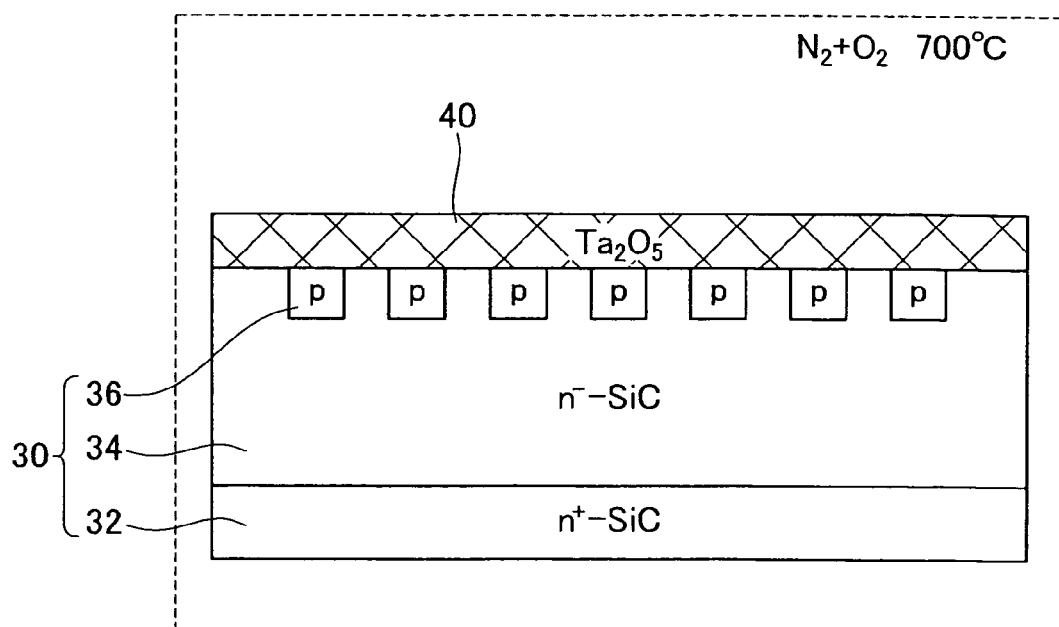
FIG. 9 shows a state of a semi-finished product of the semiconductor device in step S60.

Next, in step S60, as shown in FIG. 9, the second annealing process is performed in which heat-treatment is performed on the silicon carbide substrate 30 that has undergone the first annealing process. The second annealing process is performed in order to oxidize the cap layer 40 formed from tantalum carbide. The second annealing process is performed in an oxygen-containing atmosphere (an atmosphere in which oxygen is present), and the process temperature is set at 700 degrees Celsius. In the present embodiment, as an example, the second annealing process is performed in a mixed atmosphere of nitrogen and oxygen. Further, the process temperature of 700 degrees Celsius is set to correspond to the oxidation onset temperature of tantalum carbide.

Tantalum carbide undergoes a significant oxidation reaction in an oxygen-containing atmosphere exceeding 700 degrees Celsius, and changes into tantalum oxide ($Ta_2O_5$). As a result, it is not necessary, for example, to plasmify oxygen and perform irradiation. Further, since tantalum oxide does not function as a passivation film, the oxidation reaction of the tantalum carbide also progresses reliably even in the deep portion of the cap layer 40 (i.e. the area within the cap layer 40 farthest away from its gas-exposed surface). Further, since tantalum oxide has an extremely brittle nature, many cracks are formed in the cap layer 40 during the oxidation reaction due to volume expansion. As a result, the cap layer 40 that has changed to tantalum oxide upon undergoing the oxidation reaction can easily be removed in a later process.

Figure 10:
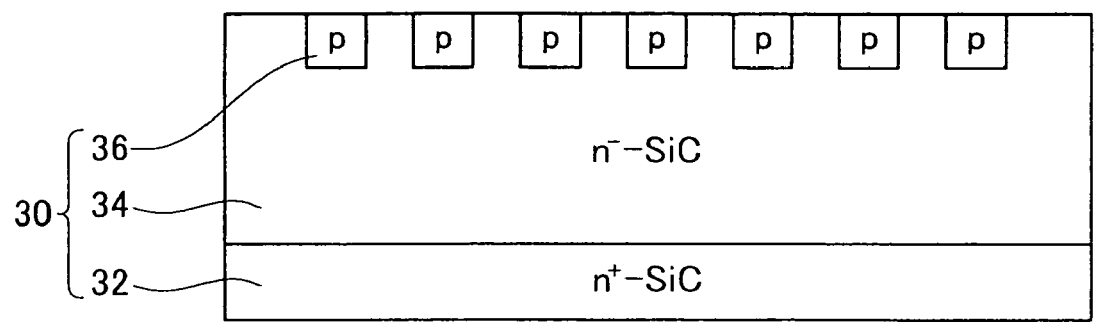
FIG. 10 shows a state of a semi-finished product of the semiconductor device in step S70.

Next, in step S70, as shown in FIG. 10, a process is performed to remove the cap layer 40 from the silicon carbide substrate 30. The cap layer 40 that has changed into tantalum oxide can be removed completely by, for example, ultrasonic cleaning.

Figure 11:
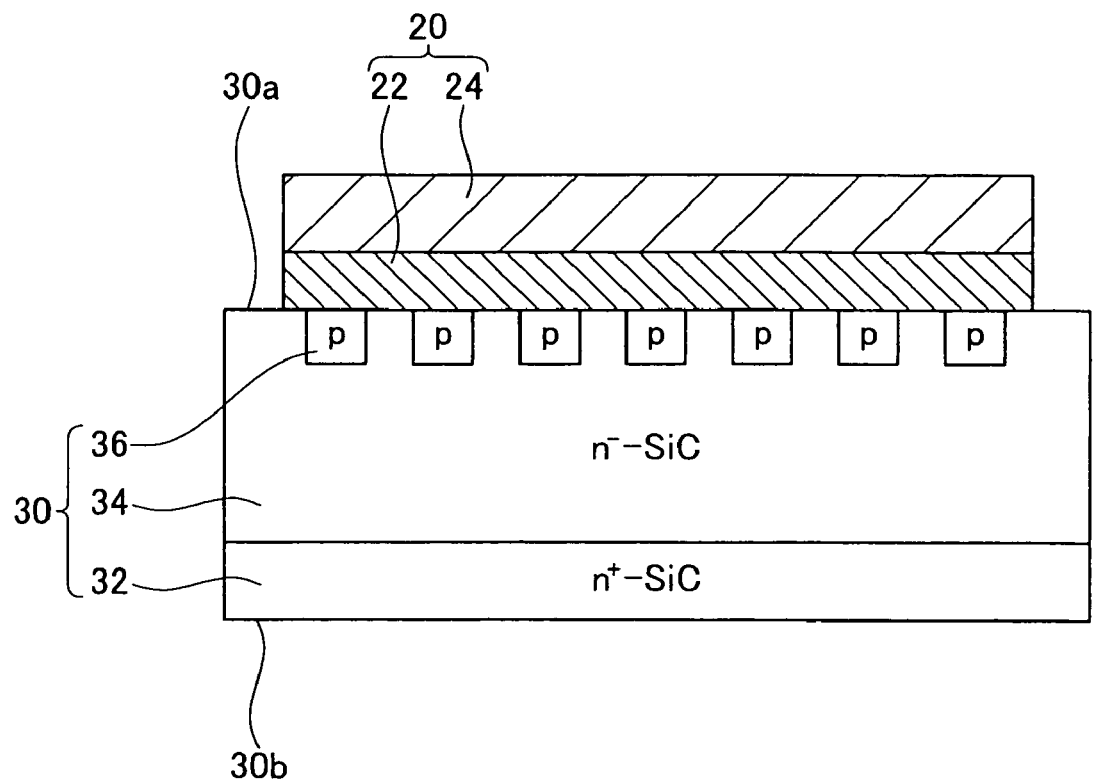
FIG. 11 shows a state of a semi-finished product of the semiconductor device in step S80.

Next, in step S80, as shown in FIG. 11, the upper electrode 20 is formed on the upper surface 30a of the silicon carbide substrate 30. In the present embodiment, the Schottky electrode 22 is formed from molybdenum on the upper surface 30a of the silicon carbide substrate 30, and the main electrode 24 is formed from aluminum on the upper part of the Schottky electrode 22. As an example, the Schottky electrode 22 can be formed with a thickness of 200 nm, and the main electrode 24 can be formed with a thickness of 3 μm.

Next, in step S90, the lower electrode 50 is formed on the lower surface 30b of the silicon carbide substrate 30. The semiconductor device 10 shown in FIG. 2 and FIG. 3 can thereby be obtained.

As described above, in the manufacturing method of the semiconductor device 10, the cap layer 40 is formed on the upper surface 30a of the silicon carbide substrate 30 prior to the first annealing process where the process temperature exceeds 1000 degrees Celsius. The tantalum carbide that constitutes the cap layer 40 has a melting point that is higher than the process temperature of the first annealing process, and further tantalum carbide is a substance that is chemically stable with respect to silicon carbide. As a result, the upper surface 30a of the silicon carbide substrate 30 is reliably protected by the cap layer 40 during the first annealing process.

However, when the tantalum carbide that constitutes the cap layer 40 is in an atmosphere in which oxygen is present, the tantalum carbide undergoes an oxidation reaction at the comparatively low temperature of 700 degrees Celsius. Usually, the silicon carbide that constitutes the silicon carbide substrate 30 does not display any significant impact to its crystal structure as long as it is heated to a temperature of 1000 degrees Celsius or below. As a result, if the cap layer 40 is formed from tantalum carbide, the crystal structure of the silicon carbide substrate 30 is not affected, and the tantalum carbide can be changed into tantalum oxide that can later be removed easily.

In the manufacturing method of the present embodiment, the cap layer 40 has been formed from tantalum carbide. However, the cap layer 40 can also be formed from other metal carbides. In this case, the melting point of the metal carbide that forms the cap layer 40 must be higher than the process temperature in the first annealing process. Here, the process temperature of the first annealing process differs according to the type of conductive impurities to be activated, and is usually set within a temperature range from 1500 degrees Celsius to 1900 degrees Celsius. As a result, it is preferred that the melting point of the material forming the cap layer 40 is 2000 degrees Celsius or above, and it is more preferred that the melting point of the material forming the cap layer 40 is higher than the melting point of silicon carbide (2730 degrees Celsius).

Further, the material forming the cap layer 40 must not affect the silicon carbide substrate 30 that consists of silicon carbide, and must be capable of undergoing an oxidation reaction. As a result, it is preferred that the material forming the cap layer 40 has an oxidation onset temperature of 1000 degrees Celsius or below.

Apart from tantalum carbide, materials that fulfill the above conditions may also include a plurality of types of metal carbide. Specifically, this includes titanium carbide (TiC), zirconium carbide (ZrC), hafnium carbide (HfC), vanadium carbide (VC), and niobium carbide (NbC). These metal carbides have a melting point of 3000 degrees Celsius or above, thus being materials having a higher melting point than the melting point of silicon carbide, and have an oxidation onset temperature of 1000 degrees Celsius or below.

In the manufacturing method described above, the second annealing process of step S60 can be performed utilizing the remaining heat from the first annealing process of step S50. That is, after heating in the first annealing process, the silicon carbide substrate 30 is placed in an oxygen-containing atmosphere at the point where the temperature of the silicon carbide substrate 30 has fallen to 1000 degrees Celsius or below that is above the oxidation onset temperature of the cap layer 40. The cap layer 40 can thereby be oxidized utilizing the remaining heat of the silicon carbide substrate 30.

A specific embodiment of the present teachings is described above, but this merely illustrates some possibilities of the teachings and does not restrict the scope of the claims. The art set forth in the claims includes variations and modifications of the specific example set forth above.

The technical elements disclosed in the specification or the drawings may be utilized separately or in all types of combinations, and are not limited to the combinations set forth in the claims at the time of filing of the application. Furthermore, the art disclosed herein may be utilized to simultaneously achieve a plurality of aims or to achieve one of these aims.

What is claimed is:

1. A manufacturing method of a semiconductor device, comprising:
    doping conductive impurities in a silicon carbide substrate;
    forming a cap layer on a surface of the silicon carbide substrate, the cap layer including at least one kind of metal carbide;
    activating the conductive impurities doped in the silicon carbide substrate by heat-treating the silicon carbide substrate in a deoxygenized atmosphere;
    oxidizing the cap layer formed on the silicon carbide substrate by heat-treating the silicon carbide substrate in an oxygen-containing atmosphere; and
    removing the oxidized cap layer from the silicon carbide substrate.

2. A manufacturing method as set forth in claim 1, wherein the cap layer is mainly composed of the at least one kind of metal carbide.

3. A manufacturing method as set forth in claim 2, wherein
    the melting point of the at least one kind of metal carbide is higher than a heat-treatment temperature for activating the conductive impurities, and
    the oxidation onset temperature of the at least one kind of metal carbide is lower than 1000 degrees Celsius.

4. A manufacturing method as set forth in claim 3, wherein the melting point of the at least one kind of metal carbide is higher than the melting point of the silicon carbide substrate.

5. A manufacturing method as set forth in claim 4, wherein the at least one kind of metal carbide is one or more of tantalum carbide, titanium carbide, zirconium carbide, hafnium carbide, vanadium carbide, and niobium carbide.

* * * * *

UNITED STATES PATENT AND TRADEMARK OFFICE
CERTIFICATE OF CORRECTION

PATENT NO. : 7,855,131 B2
APPLICATION NO. : 12/385782
DATED : December 21, 2010
INVENTOR(S) : Hirokazu Fujiwara et al.

It is certified that error appears in the above-identified patent and that said Letters Patent is hereby corrected as shown below:

Title page,
Change "(75), Inventors, Hirokazu Fujiwara, Nishikamo-gun (JP); Masaki Konishi, Toyota (JP); Takeo Yamamoto, Nishikamo-gun (JP); Eiichi Okuno, Mizuho (JP); Yukihiko Watanbe, Nagoya (JP); Takashi Katsuno, Ichinomiya (JP)" to
--(75), Inventors, Hirokazu Fujiwara, Nishikamo-gun (JP); Masaki Konishi, Toyota (JP); Takeo Yamamoto, Nishikamo-gun (JP); Eiichi Okuno, Mizuho (JP); Yukihiko Watanabe, Nagoya (JP); Takashi Katsuno, Ichinomiya (JP)--

Signed and Sealed this
Nineteenth Day of April, 2011

David J. Kappos
*Director of the United States Patent and Trademark Office*